(12) United States Patent
Jan et al.

(10) Patent No.: US 7,579,694 B2
(45) Date of Patent: Aug. 25, 2009

(54) ELECTRONIC DEVICES INCLUDING OFFSET CONDUCTIVE BUMPS

(75) Inventors: Jong-Rong Jan, Hualian Hsien (TW);
Tsai-Hua Lu, Hisn-Chu (TW);
Sao-Ling Chiu, Hisn-Chu (TW);
Ling-Chen Kung, Hisn-Chu (TW)

(73) Assignee: Unitive International Limited, Curacao (AN)

( * ) Notice: Subject to any disclaimer, the term of this patent is extended or adjusted under 35 U.S.C. 154(b) by 271 days.

(21) Appl. No.: 11/446,341

(22) Filed: Jun. 2, 2006

(65) Prior Publication Data

US 2006/0231951 A1 Oct. 19, 2006

Related U.S. Application Data

(62) Division of application No. 10/780,529, filed on Feb. 17, 2004, now Pat. No. 7,081,404.

(60) Provisional application No. 60/448,096, filed on Feb. 18, 2003.

(51) Int. Cl.
*H01L 23/48* (2006.01)
(52) U.S. Cl. ............ 257/778; 257/780; 257/E27.137
(58) Field of Classification Search ............ 438/780, 438/737, 738, 683, 687, 612; 257/737, 778, 257/763, 780
See application file for complete search history.

(56) References Cited

U.S. PATENT DOCUMENTS

| | | | |
|---|---|---|---|
| 3,105,869 A | 10/1963 | Branch et al. | |
| 3,244,947 A | 4/1966 | Slater | |
| 3,259,814 A | 7/1966 | Green | |
| 3,274,458 A | 9/1966 | Boyer et al. | |
| 3,316,465 A | 4/1967 | von Bermuth et al. | |
| 3,458,925 A | 8/1969 | Napier et al. | |
| 3,461,357 A | 8/1969 | Mutter et al. | |
| 3,489,965 A | 1/1970 | Helsdon | |
| 3,501,681 A | 3/1970 | Weir | |

(Continued)

FOREIGN PATENT DOCUMENTS

CN 1269607 10/2000

(Continued)

OTHER PUBLICATIONS

Adema et al. "Flip Chip Technology: A Method for Providing Known Good Die with High Density Interconnections" MCM '94 Proceedings, pp. 41-49.

(Continued)

*Primary Examiner*—Phat X Cao
*Assistant Examiner*—Nga Doan
(74) *Attorney, Agent, or Firm*—Myers Bigel Sibley & Sajovec, P.A.

(57) ABSTRACT

Bumping a substrate having a metal layer thereon may include forming a barrier layer on the substrate including the metal layer and forming a conductive bump on the barrier layer. Moreover, the barrier layer may be between the conductive bump and the substrate, and the conductive bump may be laterally offset from the metal layer. After forming the conductive bump, the barrier layer may be removed from the metal layer thereby exposing the metal layer while maintaining a portion of the barrier layer between the conductive bump and the substrate. Related structures are also discussed.

19 Claims, 5 Drawing Sheets

U.S. PATENT DOCUMENTS

| | | |
|---|---|---|
| 3,625,837 A | 12/1971 | Nelson et al. |
| 3,663,184 A | 5/1972 | Wood et al. |
| 3,760,238 A | 9/1973 | Hamer et al. |
| 3,770,874 A | 11/1973 | Krieger et al. |
| 3,839,727 A | 10/1974 | Herdzik et al. |
| 3,871,015 A | 3/1975 | Lin et al. |
| 3,897,871 A | 8/1975 | Zimnbauer |
| 3,916,080 A | 10/1975 | Wakamatsu |
| 3,942,187 A | 3/1976 | Gelsing et al. |
| 3,959,577 A | 5/1976 | Frink |
| 3,986,255 A | 10/1976 | Mandal |
| 3,993,123 A | 11/1976 | Chu et al. |
| 4,074,342 A | 2/1978 | Honn et al. |
| 4,113,578 A | 9/1978 | Del Monte |
| 4,113,587 A | 9/1978 | Chikamori |
| 4,168,480 A | 9/1979 | De Lucia |
| 4,244,002 A | 1/1981 | Sato et al. |
| 4,257,905 A | 3/1981 | Christophorou et al. |
| 4,266,282 A | 5/1981 | Henle et al. |
| 4,273,859 A | 6/1981 | Mones et al. |
| 4,382,517 A | 5/1983 | Welsch |
| 4,449,580 A | 5/1984 | Reisman et al. |
| 4,473,263 A | 9/1984 | Sunstein |
| 4,505,029 A | 3/1985 | Owyang et al. |
| 4,511,873 A | 4/1985 | Baier et al. |
| 4,532,576 A | 7/1985 | Reimer |
| 4,545,610 A | 10/1985 | Lakritz et al. |
| 4,563,697 A | 1/1986 | Miura |
| 4,565,901 A | 1/1986 | Hirooka et al. |
| 4,657,146 A | 4/1987 | Walters |
| 4,661,375 A | 4/1987 | Thomas |
| 4,673,772 A | 6/1987 | Satoh et al. |
| 4,733,813 A | 3/1988 | Le Meau et al. |
| 4,752,027 A | 6/1988 | Oschwend |
| 4,763,829 A | 8/1988 | Sherry |
| 4,783,722 A | 11/1988 | Osaki et al. |
| 4,817,850 A | 4/1989 | Wiener-Avenear et al. |
| 4,830,264 A | 5/1989 | Bitaillou et al. |
| 4,840,302 A | 6/1989 | Gardner et al. |
| 4,855,809 A | 8/1989 | Malhi et al. |
| 4,878,611 A | 11/1989 | LoVasco et al. |
| 4,893,403 A | 1/1990 | Heflinger et al. |
| 4,897,508 A | 1/1990 | Mahulikar et al. |
| 4,897,918 A | 2/1990 | Osaka et al. |
| 4,927,505 A | 5/1990 | Sharma et al. |
| 4,931,410 A | 6/1990 | Tokanaga et al. |
| 4,940,181 A | 7/1990 | Juskey, Jr. et al. |
| 4,948,754 A | 8/1990 | Kondo et al. |
| 4,950,623 A | 8/1990 | Dishon |
| 4,962,058 A | 10/1990 | Cronin et al. |
| 4,972,988 A | 11/1990 | Ohdate |
| 5,019,943 A | 5/1991 | Fassbender |
| 5,022,580 A | 6/1991 | Pedder |
| 5,024,372 A | 6/1991 | Altman et al. |
| 5,046,161 A | 9/1991 | Takada |
| 5,048,747 A | 9/1991 | Clark et al. |
| 5,113,314 A | 5/1992 | Wheeler et al. |
| 5,130,275 A | 7/1992 | Dion |
| 5,130,779 A | 7/1992 | Agarwala et al. |
| 5,135,155 A | 8/1992 | Kang et al. |
| 5,147,084 A | 9/1992 | Behun et al. |
| 5,152,451 A | 10/1992 | Derveaux et al. |
| 5,154,341 A | 10/1992 | Melton et al. |
| 5,160,409 A | 11/1992 | Moore et al. |
| 5,162,257 A | 11/1992 | Yung |
| 5,171,711 A | 12/1992 | Tobimatsu et al. |
| 5,194,137 A | 3/1993 | Moore et al. |
| 5,211,807 A | 5/1993 | Yee |
| 5,216,280 A | 6/1993 | Tanaka et al. |
| 5,227,664 A | 7/1993 | Toshio |
| 5,234,149 A | 8/1993 | Katz et al. |
| 5,239,447 A | 8/1993 | Cotues et al. |
| 5,240,881 A | 8/1993 | Cayetano et al. |
| 5,250,843 A | 10/1993 | Eichelberger |
| 5,251,806 A | 10/1993 | Agarwala et al. |
| 5,289,925 A | 3/1994 | Newmark |
| 5,293,006 A | 3/1994 | Yung |
| 5,325,265 A | 6/1994 | Turlik et al. |
| 5,327,013 A | 7/1994 | Moore et al. |
| 5,327,327 A | 7/1994 | Frew et al. |
| 5,329,068 A | 7/1994 | Hirata et al. |
| 5,335,795 A | 8/1994 | Chizen |
| 5,347,428 A | 9/1994 | Carson et al. |
| 5,354,711 A | 10/1994 | Heitzmann et al. |
| 5,381,946 A | 1/1995 | Koopman et al. |
| 5,391,514 A | 2/1995 | Gall et al. |
| 5,406,701 A | 4/1995 | Pepe et al. |
| 5,409,862 A | 4/1995 | Wada et al. |
| 5,424,920 A | 6/1995 | Miyake |
| 5,432,729 A | 7/1995 | Carson et al. |
| 5,453,582 A | 9/1995 | Amano et al. |
| 5,462,638 A | 10/1995 | Datta et al. |
| 5,470,787 A | 11/1995 | Greer |
| 5,471,092 A | 11/1995 | Chan et al. |
| 5,475,280 A | 12/1995 | Jones et al. |
| 5,492,235 A | 2/1996 | Crafts et al. |
| 5,539,186 A | 7/1996 | Abrami et al. |
| 5,542,174 A | 8/1996 | Chiu |
| 5,547,740 A | 8/1996 | Higdon et al. |
| 5,551,627 A | 9/1996 | Leicht et al. |
| 5,553,769 A | 9/1996 | Ellerson et al. |
| 5,557,502 A | 9/1996 | Bannerjee et al. |
| 5,609,287 A | 3/1997 | Izuta et al. |
| 5,616,962 A | 4/1997 | Ishikawa et al. |
| 5,627,396 A | 5/1997 | James et al. |
| 5,634,268 A | 6/1997 | Dalal et al. |
| 5,680,296 A | 10/1997 | Hileman et al. |
| 5,736,456 A | 4/1998 | Akram |
| 5,739,053 A | 4/1998 | Kawakita et al. |
| 5,744,382 A | 4/1998 | Kitayama et al. |
| 5,751,556 A | 5/1998 | Butler et al. |
| 5,759,437 A | 6/1998 | Datta et al. |
| 5,773,359 A | 6/1998 | Mitchell et al. |
| 5,793,116 A | 8/1998 | Rinne et al. |
| 5,796,168 A | 8/1998 | Datta et al. |
| 5,796,591 A | 8/1998 | Dalal et al. |
| 5,812,378 A | 9/1998 | Fielstad et al. |
| 5,851,911 A | 12/1998 | Farnworth |
| 5,859,470 A | 1/1999 | Ellerson et al. |
| 5,886,393 A | 3/1999 | Merrill et al. |
| 5,891,756 A | 4/1999 | Erickson et al. |
| 5,892,179 A | 4/1999 | Rinne et al. |
| 5,898,574 A | 4/1999 | Tan et al. |
| 5,902,686 A | 5/1999 | Mis |
| 5,906,312 A | 5/1999 | Zakel et al. |
| 5,920,125 A | 7/1999 | Ellerson et al. |
| 5,923,539 A | 7/1999 | Matsui et al. |
| 5,937,320 A | 8/1999 | Andricacos et al. |
| 5,963,793 A | 10/1999 | Rinne et al. |
| 5,990,472 A | 11/1999 | Rinne |
| 6,015,505 A | 1/2000 | David et al. |
| 6,027,957 A | 2/2000 | Merritt et al. |
| 6,083,773 A | 7/2000 | Lake |
| 6,117,299 A | 9/2000 | Rinne et al. |
| 6,121,069 A | 9/2000 | Boyko et al. |
| 6,130,170 A | 10/2000 | David et al. |
| 6,133,065 A | 10/2000 | Akram |
| 6,134,120 A | 10/2000 | Baldwin |
| 6,162,652 A | 12/2000 | Dass et al. |
| 6,169,325 B1 | 1/2001 | Azuma |
| 6,208,018 B1 | 3/2001 | Ma et al. |
| 6,221,682 B1 | 4/2001 | Danziger et al. |
| 6,222,279 B1 | 4/2001 | Mis et al. |
| 6,224,690 B1 | 5/2001 | Andricacos et al. |

| | | |
|---|---|---|
| 6,231,743 B1 | 5/2001 | Etherington |
| 6,238,951 B1 | 5/2001 | Caillat |
| 6,281,106 B1 | 8/2001 | Higdon et al. |
| 6,320,262 B1 | 11/2001 | Murakami |
| 6,329,608 B1 | 12/2001 | Rinne et al. |
| 6,332,988 B1 | 12/2001 | Berger, Jr. et al. |
| 6,335,104 B1 | 1/2002 | Sambucetti et al. |
| 6,346,469 B1 | 2/2002 | Greer |
| 6,380,555 B1 | 4/2002 | Hembree et al. |
| 6,388,203 B1 | 5/2002 | Rinne et al. |
| 6,389,691 B1 | 5/2002 | Rinne et al. |
| 6,392,163 B1 | 5/2002 | Rinne et al. |
| 6,415,974 B2 | 7/2002 | Jao |
| 6,418,033 B1 | 7/2002 | Rinne |
| 6,419,974 B1 | 7/2002 | Silva et al. |
| 6,440,291 B1 | 8/2002 | Henri et al. |
| 6,441,487 B2 | 8/2002 | Elenius et al. |
| 6,452,270 B1 | 9/2002 | Huang |
| 6,452,271 B2 | 9/2002 | Jiang et al. |
| 6,475,896 B1 | 11/2002 | Hashimoto |
| 6,492,197 B1 | 12/2002 | Rinne |
| 6,495,018 B1 | 12/2002 | Lowe |
| 6,521,996 B1 | 2/2003 | Seshan |
| 6,620,722 B2 | 9/2003 | Kuo et al. |
| 6,622,907 B2 | 9/2003 | Fanti et al. |
| 6,668,449 B2 | 12/2003 | Rumsey et al. |
| 6,743,660 B2 * | 6/2004 | Lee et al. .................... 438/108 |
| 6,749,760 B2 * | 6/2004 | Danielson et al. ............. 216/13 |
| 6,762,122 B2 * | 7/2004 | Mis et al. .................... 438/683 |
| 6,793,792 B2 | 9/2004 | Jones et al. |
| 6,835,643 B2 | 12/2004 | Akram |
| 6,853,076 B2 | 2/2005 | Datta et al. |
| 2001/0011764 A1 | 8/2001 | Elenius et al. |
| 2001/0020745 A1 | 9/2001 | Jiang et al. |
| 2001/0042918 A1 | 11/2001 | Yanagida |
| 2002/0000665 A1 | 1/2002 | Barr et al. |
| 2002/0056742 A1 | 5/2002 | Rinne |
| 2002/0079576 A1 | 6/2002 | Seshan |
| 2002/0086520 A1 | 7/2002 | Chiang |
| 2002/0093098 A1 | 7/2002 | Barr et al. |
| 2002/0096764 A1 * | 7/2002 | Huang ........................ 257/737 |
| 2002/0197842 A1 | 12/2002 | Kuo et al. |
| 2003/0000738 A1 | 1/2003 | Rumsey et al. |
| 2003/0027379 A1 | 2/2003 | Liu |
| 2003/0060040 A1 | 3/2003 | Lee et al. |
| 2003/0107137 A1 | 6/2003 | Stierman et al. |
| 2003/0124833 A1 | 7/2003 | Tong et al. |
| 2003/0143830 A1 | 7/2003 | Akram |
| 2003/0186487 A1 | 10/2003 | Hogerl |
| 2004/0053483 A1 | 3/2004 | Nair et al. |

FOREIGN PATENT DOCUMENTS

| | | |
|---|---|---|
| DE | 42 05 029 C | 2/1993 |
| DE | 43 23 799 A1 | 1/1994 |
| DE | 197 41 436 | 12/1998 |
| EP | 0 355 478 | 2/1990 |
| EP | 0 603 296 | 6/1994 |
| EP | 0 609 062 A1 | 8/1994 |
| EP | 0 736 972 A1 | 10/1996 |
| EP | 0 757 386 A2 | 2/1997 |
| EP | 0 782 191 A2 | 2/1997 |
| EP | 0 907 207 A2 | 4/1999 |
| EP | 1 146 552 | 10/2001 |
| EP | 1 148 548 | 10/2001 |
| FR | 2 406 893 | 10/1978 |
| FR | 2 688 628 | 9/1993 |
| FR | 2 705 832 | 12/1994 |
| GB | 1 288 564 | 9/1972 |
| GB | 2 062 963 | 5/1981 |
| GB | 2 194 387 | 3/1988 |
| JP | 54-050269 | 4/1979 |
| JP | 54-128669 | 10/1979 |
| JP | 55-111127 | 8/1980 |
| JP | 57-73952 | 5/1982 |
| JP | 57-197838 | 12/1982 |
| JP | 59-154041 | 9/1984 |
| JP | 06-116552 | 1/1986 |
| JP | 63-099558 | 4/1988 |
| JP | 63-222445 | 9/1988 |
| JP | 4-133330 | 5/1992 |
| JP | 4-150033 | 5/1992 |
| JP | 7-066207 | 3/1995 |
| JP | 7-226400 | 8/1995 |
| JP | 2000349111 | 12/2000 |
| JP | 2002203868 | 7/2002 |
| WO | WO 93/02831 | 2/1993 |
| WO | WO 93/22475 | 11/1993 |
| WO | WO 96/30933 | 10/1996 |
| WO | WO 96/31905 | 10/1996 |
| WO | WO 97/03465 | 1/1997 |
| WO | WO 97/45871 | 12/1997 |
| WO | WO 98/06118 | 2/1998 |
| WO | WO 02/03461 | 1/2002 |

OTHER PUBLICATIONS

Arai et al. "Sn-Ag Solder Bump Formation for Flip-Chip Bonding by Electroplating" Journal of the Electrochemical Society 150(10):c730-c734 (2003).

Audet et al. Low Cost Bumping Process for Flip Chip Proc. 1995 International Flip Chip, BGA, and Ado Pkg. Symposium ITAP 95, '95 Flip Chip, BGA, TAB & AP Symposium, pp. 16-21 (1995).

Chan. "Investigation of Cr/Cu/Cu/Ni Under Bump Metallization for Lead-Free Applications" 2002 Electronics Packaging Technology Conference pp. 270-275 (2002).

Choi et al. "Electromigration of Flip Chip Solder Bump on Cu/Ni(V) Al Thin Film Under Bump Metallization" 2002 Electronic Components and Technology Conference pp. 1201-1205 (2002).

R.B. Danzi and Allen McLaurin. "The Use of Concentrated Hydrogen Peroxide for the Removal of a TiW ARC from Aluminum Bond Pads" IEEE/CPMT Int'l Electronics Manufacturing Technology Symposium pp. 99-104 (1997).

Datta et al. "Electrochemical Fabrication of Mechanically Robust PbSn C4 Interconnections" J. Electrochem. Soc. 142(11):3779-3785 (Nov. 1995).

Drake et al. "An Electrostatically Actuated Micro-Relay" Transducers '95, Eurosensors IX, The 8th International Conference on Solid-State Sensors and Actuators. and Eurosensors IX pp. 380-383.

Edelstein et al. Derwent Publications Ltd. London, GB: AN 2002-308284 XP-002243726.

Ezawa et al. "Eutectic Sn-Ag Solder Bump Process for ULSI Flip Chip Technology" IEEE Transactions on Electronics Packaging Manufacturing 24(4):275-281 (2001).

Ezawa et al. "Pb-Free Bumping by Alloying Electroplated Metal Stacks" 2003 Electronic Components and Technology Conference pp. 664-667 (2003).

Akira Furuya and Yoshio Ohshita. "Ti Concentration Effect on Adhesive Energy at Cu/TiW Interface" Journal of Applied Physics 84(9):4941-4944 (Nov. 1998).

Graf. "The Modern Dictionary of Electronics" Sixth Edition pp. 386 (1984).

Greer. "An Extended Eutectec Solder Bump for FCOB" 1996 Electronic Components and Technology Conference pp. 546-551 (1996).

Guckel et al. "Electromagnetic Linear Actuators with Inductive Position Sensing for Micro Relay, Micro Value and Precision Positioning Applications" Transducers '95, Eurosensors IX, The 8th International Conference on Solid-State Sensors and Actuators, and Eurosensors IX pp. 324-327.

Hashimoto et al. "Thermally Controlled Magnetization Microrelay" Transducers '95, Eurosensors IX, The 8th International Conference on Solid-State Sensors and Actuators, and Eurosensors IX pp. 324-327.

Julia Hawley and Van-Vo. "Solutions to Catastrophic Yield Problems in MCM-D Interconnect Production" 1998 International Conference on Multichip Modules and High Density Packaging pp. 118-123.

Hirsch. "Tin-Lead, Lead and Tin Plating, Metal Finishing" Guidebook Directory, 55th Guidebook-Directory Issue 1987 85(1A):280-284 ISSN 0026-0576 (Mid Jan. 1987).

Hosaka et al. "Electromagnetic Microrelays: Concepts and Fundamental Characteristics, Sensors and Actuators A" 40:41-47 (1994).

Howell et al. "Area Array Solder Interconnection Technology for the Three-Dimensional Silicon Cube" Proceedings of the 1995 45th Electronic Components & Technology Conference pp. 1174-1178 (1995).

Inaba et al. "Solder Bump Formation Using Electroless Plating and Ultrasonic Soldering" IEEE Transactions on Components, Hybrids, and Manufacturing Technology 13(1):119-123 (1990).

Jung et al. "The Influence of NiSn Intermetallics on the Performance of Flip Chip Contacts Using a Low Cost Electroless Nickel Bumping Approach" IEPS Proceedings of the Technical Conference, 1996 Electronics Packaging Conference, Austin, Texas pp. 14-25 (Sep. 29-Oct. 1, 1996).

Kang et al. "Interfacial Reactions During Soldering With Lead-Tin Eutectic and Lead (Pb)-Free, Tin-Rich Solders" Journal of Electronic Materials 25(7):1113-1120 (1996).

Kim et al. "Electrodeposition of Near-Eutectic SnAg Solders for Wafter-Level Packaging" Journal of the Electrochemical Society 150(9):c577-C584 (2003).

Kiumi et al. "Processing, Properties and Reliability of Electroplated Lead-Free Solder Bumps" IEEE 2002 Inter Society Conference on Thermal Phenomena pp. 909-914 (2002).

Knuppel. "Rugged Design for Reliable Switching: Micro a Relay Sets New Automotive Standards" Components XXIX 4:30-32 (1994).

Lineback. "3D IC Packaging Moves Closer to Commercial Use" Electronic World News pp. 15 (May 21, 1990).

Mis et al. "Flip Chip Production Experience: Some Design, Process, Reliability and Cost Considerations" ISHM '96 Proceedings, Proc. 1996 International Symposium on Microelectronics SPIE 2920:291-295 (1996).

Multimedia Card Association, www.mmca.org.

PCB Assembly, Electronic Packaging & Production 35(1):40 (Jan. 1995).

SanDisk Corporation, SanDisk Flash Data Storage, San Disk Compact Flash™ and MultiMedia Card: Small Form Factor Solutions (1999).

Solomon. "Providing High Density and Performance for Chip-to System Interconnection" Advanced Packaging pp. 19-28 (Nov. 2001).

Specification Sheet. NaiS, Ultra Low Profile 2-Amp-Polarized Relay, TK-Relays.

Tessier et al. "Process Considerations in Fabricating Thin Film Multi-Chip Modules" Proceedings of the Technical Conference 1989 International Electronics Packaging Conference (1989).

Yung et al. "Flip-Chip Process Utilizing Electroplated Solder Joints" Proceedings of the Technical Conference, International Electronics Packaging Conference, Malborough Massachusetts pp. 1065-1073 (Sep. 10-12, 1990).

Yung et al. "Electroplated Solder Joints for Flip-Chip Applications" Transactions on Components, Hybrids and Manufacturing Technology 14(3):549-559 (Sep. 1991).

Zeng et al. "Six Cases of Reliability Study of Pb-Free Solder Joints in Electronic Packaging Technology Reports: A review Journal" Materials Science and Engineering R 38:55-105 (2002).

* cited by examiner

ELECTRONIC DEVICES INCLUDING OFFSET CONDUCTIVE BUMPS

RELATED APPLICATION

This application claims the benefit of priority as a divisional application of U.S. Utility application Ser. No. 10/780,529 filed on Feb. 17, 2004, now U.S. Pat. No. 7,081,404, which claims the benefit of priority from U.S. Provisional Patent Application No. 60/448,096 filed on Feb. 18, 2003. The disclosures of both of the above referenced applications are hereby incorporated herein by reference in their entirety.

FIELD OF THE INVENTION

The present invention relates to the field of integrated circuits and more particularly to methods of bumping integrated circuit substrates.

BACKGROUND OF THE INVENTION

High performance microelectronic devices often use solder balls or solder bumps for electrical interconnection to other microelectronic devices. For example, a very large scale integration (VLSI) chip may be electrically connected to a circuit board or other next level packaging substrate using solder balls or solder bumps. This connection technology is also referred to as "Controlled Collapse Chip Connection-C4" or "flip-chip" technology, and will be referred to herein as solder bumps.

According to solder bump technology developed by IBM, solder bumps are formed by evaporation through openings in a shadow mask which is clamped to an integrated circuit wafer. For example, U.S. Pat. No. 5,234,149 entitled "Debondable Metallic Bonding Method" to Katz et al. discloses an electronic device with chip wiring terminals and metallization layers. The wiring terminals are typically essentially aluminum, and the metallization layers may include a titanium or chromium localized adhesive layer, a co-deposited localized chromium copper layer, a localized wettable copper layer, and a localized gold or tin capping layer. An evaporated localized lead-tin solder layer is located on the capping layer.

Solder bump technology based on an electroplating method has also been actively pursued. The electroplating method is particularly useful for larger substrates and smaller bumps. In this method, an "under bump metallurgy" (UBM) layer is deposited on a microelectronic substrate having contact pads thereon, typically by evaporation or sputtering. A continuous under bump metallurgy layer is typically provided on the pads and on the substrate between the pads to allow current flow during solder plating.

An example of an electroplating method with an under bump metallurgy layer is discussed in U.S. Pat. No. 5,162,257 entitled "Solder Bump Fabrication Method" to Yung and assigned to the assignee of the present application. In this patent, the under bump metallurgy layer includes a chromium layer adjacent the substrate and pads, a top copper layer which acts as a solderable metal, and a phased chromium/copper layer between the chromium and copper layers. The base of the solder bump is preserved by converting the under bump metallurgy layer between the solder bump and contact pad into an intermetallic of the solder and the solderable component of the under bump metallurgy layer.

SUMMARY OF THE INVENTION

According to embodiments of the present invention, an integrated circuit substrate includes a metal layer thereon, a barrier layer is formed on the integrated circuit substrate including the metal layer, and a conductive bump is formed on the barrier layer. More particularly, the barrier layer is between the conductive bump and the substrate, and the conductive bump is offset from the metal layer. After forming the conductive bump, at least portions of the barrier layer are removed from the metal layer thereby exposing the metal layer while a portion of the barrier layer is maintained between the conductive bump and the substrate. The metal layer may be an aluminum layer, and/or the barrier layer may be a layer of TiW. Moreover, the metal layer, the barrier layer, and the conductive bump may be layers of different materials.

A conductive under bump metallurgy layer may also be formed on the barrier layer before forming the conductive bump. Before removing the barrier layer, the conductive under bump metallurgy layer may be removed from the barrier layer opposite the metal layer while maintaining a portion of the conductive under bump metallurgy layer between the conductive bump and the substrate. The conductive under bump metallurgy layer may include a layer of copper, and the conductive under bump metallurgy layer and the barrier layer may be layers of different materials.

A second barrier layer may also be formed on the under bump metallurgy layer before forming the conductive bump with the second barrier layer and the under bump metallurgy layer being layers of different materials. Moreover, the second barrier layer may be between the conductive bump and the conductive under bump metallurgy layer. The second barrier layer may be a layer of nickel, and the under bump metallurgy layer may be a layer of copper.

The second barrier layer may be selectively formed on a portion of the under bump metallurgy layer with the second barrier layer being offset from the metal layer. Moreover, the conductive bump may be selectively formed on the second barrier layer offset from the metal layer. In addition, the second barrier layer and the conductive bump may be selectively formed using a same mask. The conductive bump may be at least one of a solder bump, a gold bump, and/or a copper bump. Moreover, the conductive bump may be selectively plated on the barrier layer offset from the metal layer.

The integrated circuit substrate may also include an input/output pad thereon. The barrier layer may be formed on the substrate including the metal layer and the input/output pad, and the conductive bump may be formed on the barrier layer opposite the input/output pad. More particularly, the metal layer and the bump pad may both be layers of aluminum.

The integrated circuit substrate may include an input/output pad thereon, the barrier layer may be formed on the substrate including the metal layer and the input/output pad, and the conductive bump may be electrically coupled to the input/output pad after removing the barrier layer from the metal layer. Moreover, the metal layer and the input/output pad may both be layers of aluminum. In addition, the conductive bump may be formed on the barrier layer opposite the input/output pad, or the conductive bump may be offset from the input/output pad. A second substrate may also be bonded to the conductive bump after removing the barrier layer from the metal layer.

According to additional embodiments of the present invention, methods of bumping an integrated circuit device include forming a barrier layer on an integrated circuit substrate wherein the barrier layer is offset from an exposed metal layer on the integrated circuit substrate. A conductive bump is formed on the barrier layer with the barrier layer being between the conductive bump and the substrate. Moreover, the conductive bump is offset from the metal layer, and the barrier layer, the conductive bump, and the metal layer may be layers of different conductive materials.

The barrier layer may be a layer of titanium tungsten, and the exposed metal layer may be a layer of aluminum. In addition, the conductive bump may be at least one of a solder bump, a gold bump, and/or a copper bump. A conductive under bump metallurgy layer may also be provided between the barrier layer and the conductive bump, and a second substrate may be bonded to the conductive bump.

The integrated circuit substrate may also include an input/output pad on the integrated circuit substrate wherein the barrier layer and the conductive bump are electrically connected to the input/output pad. Moreover, the input/output pad and the metal layer may each be layers of aluminum. In addition, the conductive bump may be on the barrier layer opposite the input/output pad, and the conductive bump may be offset from the input/output pad. An under bump metallurgy layer may also be between the barrier layer and the conductive bump, and the under bump metallurgy layer and the barrier layer may be layers of different materials.

According to still additional embodiments of the present invention, an integrated circuit device includes an integrated circuit substrate having an exposed metal layer thereon. A barrier layer is on the integrated circuit substrate offset from the exposed metal layer, and a conductive bump is on the barrier layer. More particularly, the barrier layer is between the conductive bump and the substrate, the conductive bump is offset from the metal layer, and the barrier layer, the conductive bump, and the metal layer all comprise different conductive materials.

DETAILED DESCRIPTION

Figure 1:
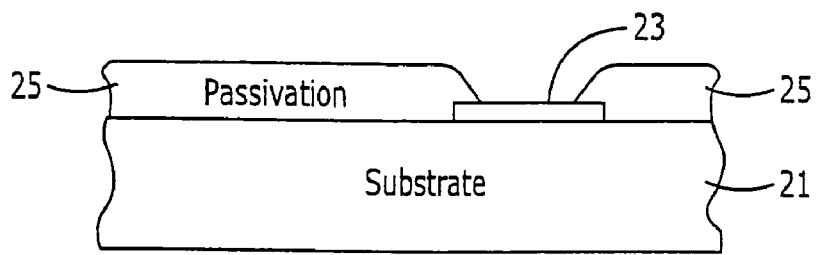
FIGS. 1-4 are cross sectional views illustrating integrated circuit devices during intermediate fabrication steps according to first embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, thicknesses of layers and regions are exaggerated for clarity. Like numbers refer to like elements throughout.

It will be understood that when an element such as a layer, region or substrate is referred to as being "on" another element, it can be directly on the other element, or intervening elements may also be present. In contrast, when an element is referred to as being "directly on" another element, there are no intervening elements present. Also, when an element is referred to as being "bonded" to another element, it can be directly bonded to the other element or intervening elements may be present. In contrast, when an element is referred to as being "directly bonded" to another element, there are no intervening elements present. It will also be understood that when an element is referred to as being "connected" or "coupled" to another element, it can be directly connected or coupled to the other element or intervening elements may be present. Finally, the term "directly" means that there are no intervening elements.

According to embodiments of the present invention, methods may be provided that allow bumping of integrated circuit substrates (such as integrated circuit wafers) while providing metal layers (such as exposed aluminum layers) exposed on the substrate. A metal layer, such as an aluminum layer, may be used to provide a wirebond contact, an exposed Input/output pad, a fuse and/or a reflector. Moreover, a conductive bump, such as a solder bump may be provided on the substrate to provide electrical and/or mechanical interconnection with another substrate. By providing an exposed metal layer after forming bumps on the substrate, a metal layer input/out pad can provide a wirebond pad after forming bumps, and/or a metal layer laser fuse can be opened using a laser after forming bumps.

First embodiments of the present invention are discussed below with reference to FIGS. 1-4. As shown in FIG. 1, an integrated circuit substrate 21 may have a metal layer 23 and a passivation layer 25 thereon. The integrated circuit substrate 21 may include a semiconductor substrate (such as a silicon, gallium arsenide, gallium nitride, and/or silicon carbide substrate) having electronic devices (such as transistors, diodes, resistors, capacitors, and/or inductors) formed thereon. As used herein, the term substrate may be used to refer to a wafer including a plurality of integrated circuit devices thereon or to an integrated circuit die including a single integrated circuit device thereon. Typically, a plurality of die can be cut from a single wafer after fabrication of a plurality of integrated circuit devices on the single wafer. In other alternatives, the term substrate may be used to refer to another layer of packaging substrate such as a printed circuit board.

The metal layer 23, for example, may provide an input/output pad for electronic devices of the substrate 21 to be used as an input/output pad for subsequent wire bonding. In an alternative, the metal layer 23 may provide a fuse that can be cut mechanically and/or with a laser to provide coupling/decoupling of redundant circuitry on the substrate 21. In another alternative, the metal layer 23 may provide a pad for electrical probing of circuitry on the substrate 21.

The passivation layer 25 may include an inorganic material (such as silicon dioxide and/or silicon nitride) and/or an organic material (such as polyimide). As shown, a hole in the passivation layer 25 may expose portions of the metal layer 23. More particularly, the passivation layer 25 may be formed over the metal layer 23, and then portions of the passivation layer 25 may be selectively removed to expose portions of the metal layer 23. By providing that portions of the metal layer 23 are exposed, the metal layer may be subsequently probed, cut, and/or used as a wire bonding pad.

Figure 2:
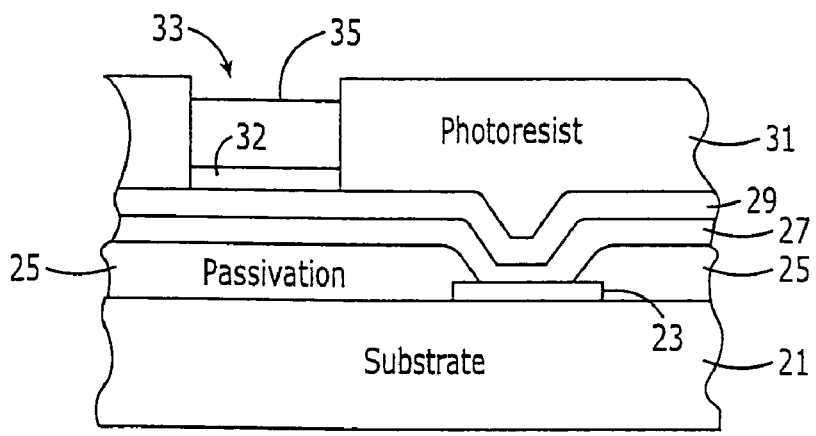

As shown in FIG. 2, a first barrier layer 27 (such as a layer of TiW, TiN, and/or combinations thereof may be formed on the passivation layer 25 and the exposed portions of the metal layer 23, for example, using sputtering, evaporation, and/or chemical vapor deposition (CVD). The exposed surface of the first barrier layer 27 may be subjected to cleaning using wet and/or dry cleaning operations before a subsequent step of forming under bump metallurgy layer 29. The first barrier layer 27 may be selected to provide adhesion between the under bump metallurgy layer 29 and the passivation layer 25; to provide electrical conduction of signals between under bump metallurgy layer 29 and the substrate 21; and/or to provide an etch selectivity with respect to the metal layer 23. Accordingly, the first barrier layer 27 may be removed from the metal layer 23 without significantly damaging the metal layer 23.

The conductive under bump metallurgy layer 29 may then be formed on the barrier layer 27 opposite the substrate 21 and the metal layer 23. More particularly, the conductive under bump metallurgy layer 29 may include copper (Cu). A mask layer 31 (such as a layer of photoresist and/or polymer) may be formed on the conductive under bump metallurgy layer 29, and a hole 33 may be formed in the mask layer 31 to provide a plating template. More particularly, the mask layer 31 may be a layer of photoresist that has been selectively exposed and developed using photolithographic techniques to form the hole 33.

A second barrier layer 32 (such as a layer of nickel) and a bumping material 35 (such as a tin based solder, gold, and/or copper) may then be selectively formed on portions of the conductive under bump metallurgy layer 29 exposed by the hole 33. For example, the second barrier layer 32 and the bumping material 35 may be electroplated with the under bump metallurgy layer 29 providing a plating electrode and a current path under the mask 31. In an alternative, electroless plating may be used so that a current path under the mask is not needed during plating. Other deposition techniques may also be used. After forming the second barrier layer 32 and the bumping material 35, the mask 31 can be stripped, for example, using a dry and/or wet process chemistry.

Figure 3:
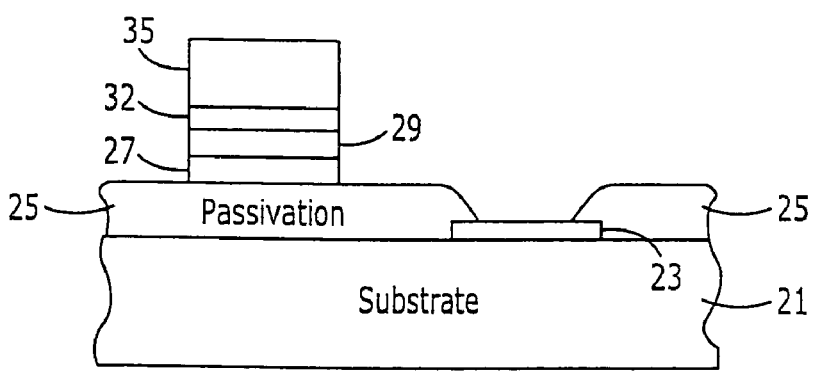

As shown in FIG. 3, portions of the conductive under bump metallurgy layer 29 not covered by the bumping material 35 and/or the second barrier layer 32 can be removed. More particularly, portions of the conductive under bump metallurgy layer 29 can be removed using an etch chemistry that removes the conductive under bump metallurgy layer 29 preferentially with respect to the first barrier layer 27. Accordingly, the first barrier layer 27 may protect the metal layer 23 while removing portions of the under bump metallurgy layer 29. With a conductive under bump metallurgy layer 29 of copper (Cu) and a first barrier layer 27 of titanium-tungsten (TiW), Ammonium Hydroxide may be used to selectively remove the conductive under bump metallurgy layer 29 while maintaining the metal layer 23.

Portions of the first barrier layer 27 not covered by the bumping material 35, the second barrier layer 32, and/or remaining portions of the under bump metallurgy layer 29 can then be removed using an etch chemistry that removes the first barrier layer 27 preferentially with respect to the metal layer 23. Accordingly, the first barrier layer 27 may be removed without significantly damaging the metal layer 23. With a first barrier layer 27 of titanium-tungsten (TiW) and a metal layer 23 of aluminum (Al), portions of the first barrier layer 27 may be removed using a mixture including:

Hydrogen peroxide—10-20%;
Sulfosalicylic acid—2-30 grams/liter;
Potassium sulfate—25-200 grams/liter;
Benzotrizole—1-10 grams/liter;
Water for makeup;
Temp: 30 to 70 deg C.; and
pH<7.

Figure 4:
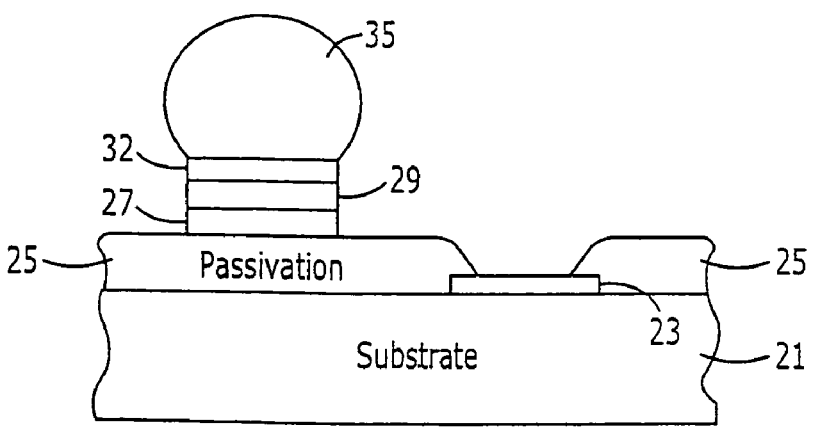

The structure of FIG. 3 can then be heated so that the bumping material 35 forms a ball while the metal layer 23 (such as an aluminum layer) is exposed as shown in FIG. 4. With a tin based solder bumping material, for example, the bumping material 35 may be fluxed, reflowed, and cleaned to provide the ball of bumping material 35 of FIG. 4. With a gold bumping material, the bumping material 35 may be annealed. In an alternative, portions of the under bump metallurgy layer 29 and the barrier layer 27 can be removed after heating the bumping material to form a ball. In another alternative, the bumping material 35 may be bonded to a compatible substrate without first forming a ball.

While not shown in FIG. 4, bumping material 35, the second barrier layer 32, the remaining portion of the conductive under bump metallurgy layer 29, and the remaining portion of the first barrier layer 27 may be electrically coupled to the substrate through a hole in the passivation layer 25 and/or a redistribution routing conductor. The bumping material 35 can be electrically coupled to a remote contact pad using a redistribution routing conductor as discussed, for example, in U.S. Pat. Nos. 5,892,179, 6,329,608, and/or U.S. Pat. No. 6,389,691. The disclosures of each of these patents are hereby incorporated herein in their entirety by reference.

Accordingly, the bumping material 35 can be used to provide electrical and/or mechanical coupling to another substrate (such as another integrated circuit semiconductor device and/or a printed circuit board) while the metal layer 23 is exposed. Accordingly, the metal layer 23 may be burned, cut, probed, and/or wire bonded after forming the bumping material 35 and/or after bonding the bumping material 35 to another substrate.

Figure 5:
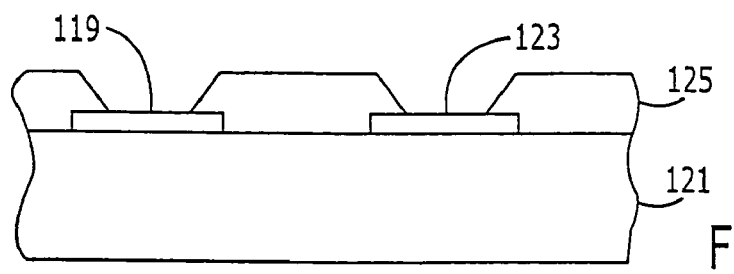
FIGS. 5-8 are cross sectional views illustrating integrated circuit devices during intermediate fabrication steps according to second embodiments of the present invention.

Second embodiments of the present invention are discussed below with reference to FIGS. 5-8. As shown in FIG. 5, an integrated circuit substrate 121 may have a metal layer 123 and an interconnection layer 119 thereon, and a passivation layer 125 may be provided on the metal layer 123, the interconnection layer 119, and the substrate 121. The metal layer 123 and the interconnection layer 119 may be patterned from a same metal layer (such as a same aluminum layer). The integrated circuit substrate 121 may include a semiconductor substrate (such as a silicon, gallium arsenide, gallium nitride, and/or silicon carbide substrate) having electronic devices (such as transistors, diodes, resistors, capacitors, and/or inductors) formed thereon. As used herein, the term substrate may be used to refer to a wafer including a plurality of integrated circuit devices thereon or to an integrated circuit die including a single integrated circuit device thereon. Typically, a plurality of die can be cut from a single wafer after fabrication of a plurality of integrated circuit devices on the single wafer. In other alternatives, the term substrate may be used to refer to another layer of packaging substrate such as a printed circuit board.

The metal layer 123, for example, may provide an input/output pad for electronic devices of the substrate 121 to be used as an input/output pad for subsequent wire bonding. In an alternative, the metal layer 123 may provide a fuse that can be cut mechanically and/or with a laser to provide coupling/decoupling of redundant circuitry on the substrate 121. In another alternative, the metal layer 123 may provide a pad for electrical probing of circuitry on the substrate 121. The interconnection layer 119 may provide electrical and mechanical interconnection through a bumping material to a next level substrate (such as a printed circuit board or an integrated circuit device) as discussed in greater detail below. The metal layer 123 and the interconnection layer 119 may both include aluminum.

The passivation layer 125 may include an inorganic material (such as silicon dioxide and/or silicon nitride) and/or an organic material (such as polyimide). As shown, holes in the passivation layer 125 may expose portions of the metal layer 123 and portions of the interconnection layer 119. More particularly, the passivation layer 125 may be formed over the metal layer 123 and the interconnection layer 119, and then portions of the passivation layer 125 may be selectively removed to expose portions of the metal layer 123 and the interconnection layer 119. By providing that portions of the metal layer 123 are exposed, the metal layer may be subsequently probed, cut, and/or used as a wire bonding pad.

Figure 6:
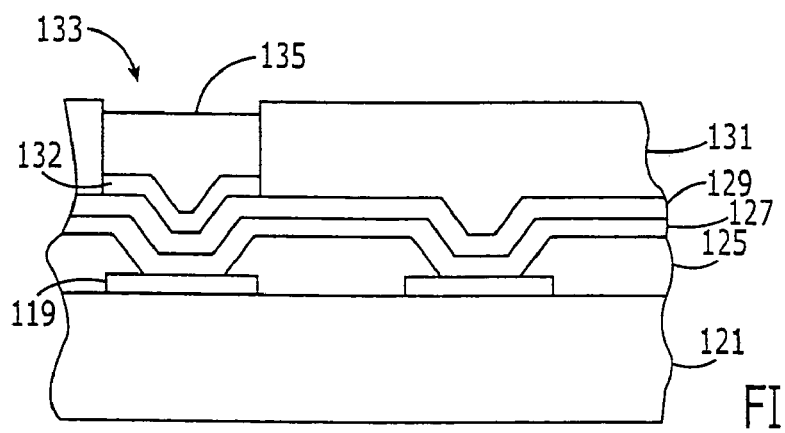

As shown in FIG. 6, a first barrier layer 127 (such as a layer of TiW, TiN, and/or combinations thereof) may be formed on the passivation layer 125, on the exposed portions of the metal layer 123, and on the exposed portions of the interconnection layer 119, for example, using sputtering, evaporation, and/or chemical vapor deposition (CVD). The exposed surface of the first barrier layer 127 may be subjected to cleaning using wet and/or dry cleaning operations before a subsequent step of forming under bump metallurgy layer 129. The first barrier layer 127 may be selected to provide adhesion between the under bump metallurgy layer 129 and the passivation layer 125; to provide adhesion between the under bump metallurgy layer 129 and the interconnection layer 119; to provide electrical conduction of signals between under bump metallurgy layer 129 and the substrate 121; and/or to provide an etch selectivity with respect to the metal layer 123. Accordingly, the first barrier layer 127 may be removed from the metal layer 123 without significantly damaging the metal layer 123.

The conductive under bump metallurgy layer 129 may then be formed on the barrier layer 127 opposite the substrate 121, the metal layer 123, and the interconnection layer 119. More particularly, the conductive under bump metallurgy layer 129 may include copper (Cu). A mask layer 131 (such as a layer of photoresist and/or polymer) may be formed on the conductive under bump metallurgy layer 129, and a hole 133 may be formed in the mask layer 131 to provide a plating template exposing portions of the under bump metallurgy layer 129 opposite the interconnection layer 119. More particularly, the mask layer 131 may be a layer of photoresist that has been selectively exposed and developed using photolithographic techniques to form the hole 133.

A second barrier layer 132 (such as a layer of nickel) and a bumping material 135 (such as a tin based solder, gold, and/or copper) may then be selectively formed on portions of the conductive under bump metallurgy layer 129 exposed by the hole 133. For example, the second barrier layer 132 and the bumping material 135 may be electroplated with the under bump metallurgy layer 129 providing a plating electrode and a current path under the mask 131. In an alternative, electroless plating may be used so that a current path under the mask is not needed during plating. Other deposition techniques may also be used. After forming the second barrier layer 132 and the bumping material 135, the mask 131 can be stripped, for example, using a dry and/or wet process chemistry.

Figure 7:
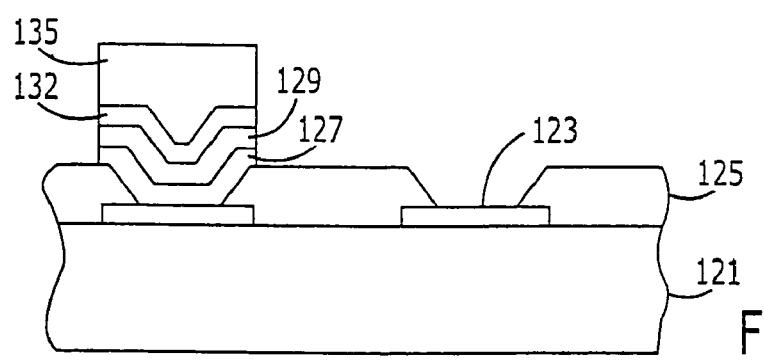

As shown in FIG. 7, portions of the conductive under bump metallurgy layer 129 not covered by the bumping material 135 and/or the second barrier layer 132 can be removed. More particularly, portions of the conductive under bump metallurgy layer 129 can be removed using an etch chemistry that removes the conductive under bump metallurgy layer 129 preferentially with respect to the first barrier layer 127. Accordingly, the first barrier layer 127 may protect the metal layer 123 while removing portions of the under bump metallurgy layer 129. With a conductive under bump metallurgy layer 129 of copper (Cu) and a first barrier layer 127 of titanium-tungsten (TiW), Ammonium Hydroxide may be used to selectively remove the conductive under bump metallurgy layer 129 while maintaining the metal layer 123.

Portions of the first barrier layer 127 not covered by the bumping material 135, the second barrier layer 132, and/or remaining portions of the under bump metallurgy layer 129 can then be removed using an etch chemistry that removes the first barrier layer 127 preferentially with respect to the metal layer 123. Accordingly, the first barrier layer 127 may be removed without significantly damaging the metal layer 123. With a first barrier layer 127 of titanium-tungsten (TiW) and a metal layer 123 of aluminum (Al), portions of the first barrier layer 127 may be removed using a mixture including:

Hydrogen peroxide—10-20%;
Sulfosalicylic acid—2-30 grams/liter;
Potassium sulfate—25-200 grams/liter;
Benzotrizole—1-10 grams/liter;
Water for makeup;
Temp: 30 to 70 deg C.; and
pH<7.

Figure 8:
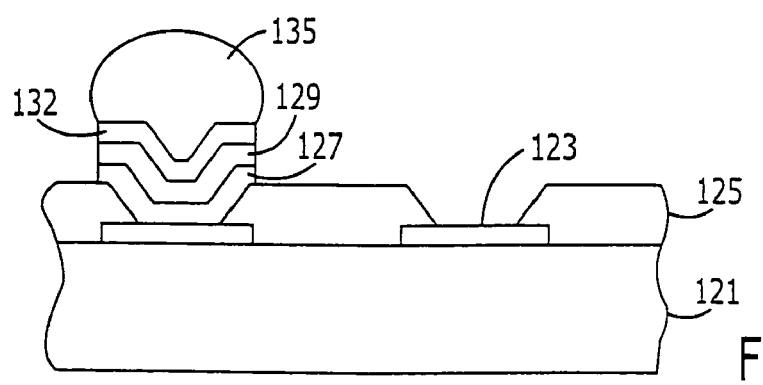

The structure of FIG. 7 can then be heated so that the bumping material 135 forms a ball while the metal layer 123 (such as an aluminum layer) is exposed as shown in FIG. 8. With a tin based solder bumping material, for example, the bumping material 135 may be fluxed, reflowed, and cleaned to provide the ball of bumping material 135 of FIG. 8. With a gold bumping material, the bumping material 135 may be annealed. In an alternative, portions of the under bump metallurgy layer 129 and the barrier layer 127 can be removed after heating the bump material to form a ball. In another alternative, the bumping material 135 may be bonded to a compatible substrate without first forming a ball.

While not shown in FIG. 8, bumping material 135, the second barrier layer 132, the remaining portion of the conductive under bump metallurgy layer 129, and the remaining portion of the first barrier layer 127 may be electrically coupled to the interconnection layer 119 through a redistribution routing conductor so that the bumping material 135 is offset from the interconnection layer 119.

Accordingly, the bumping material 135 can be used to provide electrical and/or mechanical coupling to another substrate (such as another integrated circuit semiconductor device and/or a printed circuit board) while the metal layer 123 is exposed. Accordingly, the metal layer 123 may be burned, cut, probed, and/or wire bonded after forming the bumping material 135 and/or after bonding the bumping material 135 to another substrate.

Figure 9:
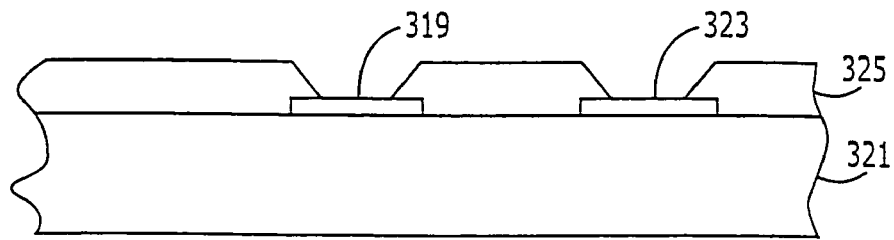
FIGS. 9-12 are cross sectional views illustrating integrated circuit devices during intermediate fabrication steps according to third embodiments of the present invention.

Third embodiments of the present invention are discussed below with reference to FIGS. 9-12. As shown in FIG. 9, an integrated circuit substrate 321 may have a metal layer 323 and an interconnection layer 319, and a passivation layer 325 may be provided on the metal layer 323, the interconnection layer 319, and the substrate 321. The metal layer 323 and the interconnection layer 319 may be patterned from a same metal layer (such as a same aluminum layer). The integrated circuit substrate 321 may include a semiconductor substrate (such as a silicon, gallium arsenide, gallium nitride, and/or silicon carbide substrate) having electronic devices (such as transistors, diodes, resistors, capacitors, and/or inductors) formed thereon. As used herein, the term substrate may be used to refer to a wafer including a plurality of integrated circuit devices thereon or to an integrated circuit die including a single integrated circuit device thereon. Typically, a plurality of die can be cut from a single wafer after fabrication of a plurality of integrated circuit devices on the single wafer. In other alternatives, the term substrate may be used to refer to another layer of packaging substrate such as a printed circuit board.

The metal layer 323, for example, may provide an input/output pad for electronic devices of the substrate 321 to be used as an input/output pad for subsequent wire bonding. In an alternative, the metal layer 323 may provide a fuse that can be cut mechanically and/or with a laser to provide coupling/decoupling of redundant circuitry on the substrate 321. In another alternative, the metal layer 323 may provide a pad for electrical probing of circuitry on the substrate 321. The interconnection layer 219 may provide electrical and mechanical interconnection through a bumping material to a next level substrate (such as a printed circuit board or an integrated circuit device) as discussed in greater detail below. The metal layer 323 and the interconnection layer 319 may both include aluminum.

The passivation layer 325 may include an inorganic material (such as silicon dioxide and/or silicon nitride) and/or an organic material (such as polyimide). As shown, holes in the passivation layer 325 may expose portions of the metal layer 323 and portions of the interconnection layer 319. More particularly, the passivation layer 325 may be formed over the metal layer 323 and the interconnection layer 319, and then portions of the passivation layer 325 may be selectively removed to expose portions of the metal layer 323 and the interconnection layer 319. By providing that portions of the metal layer 323 are exposed, the metal layer may be subsequently probed, cut, and/or used as a wire bonding pad.

Figure 10:
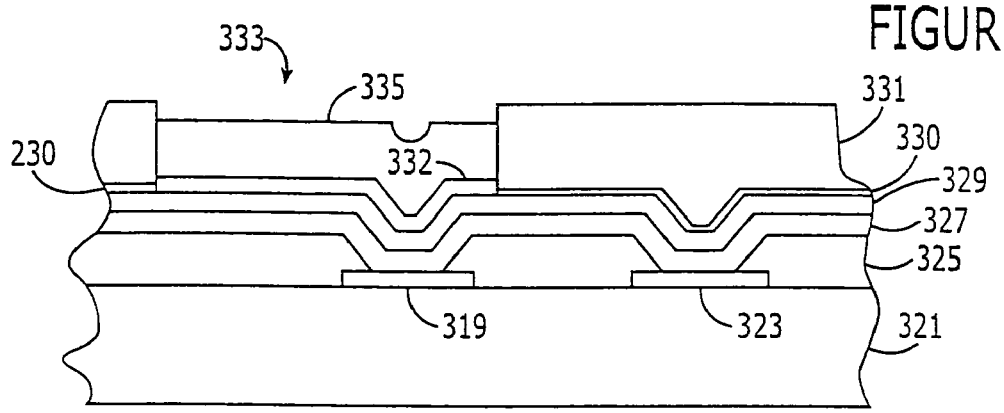

As shown in FIG. 10, a first barrier layer 327 (such as a layer of TiW, TiN, and/or combinations thereof) may be formed on the passivation layer 325, on the exposed portions of the metal layer 323, and on the exposed portions of the interconnection layer 319, for example, using sputtering, evaporation, and/or chemical vapor deposition (CVD). The exposed surface of the first barrier layer 327 may be subjected to cleaning using wet and/or dry cleaning operations before a subsequent step of forming under bump metallurgy layer 329. The first barrier layer 327 may be selected to provide adhesion between the under bump metallurgy layer 329 and the passivation layer 325; to provide adhesion between the under bump metallurgy layer 329 and the interconnection layer 319; to provide electrical conduction of signals between under bump metallurgy layer 329 and the substrate 321; and/or to provide an etch selectivity with respect to the metal layer 323. Accordingly, the first barrier layer 327 may be removed from the metal layer 323 without significantly damaging the metal layer 323.

The conductive under bump metallurgy layer 329 may then be formed on the barrier layer 327 opposite the substrate 321, on the metal layer 323, and on the interconnection layer 319. More particularly, the conductive under bump metallurgy layer 329 may include copper (Cu). In addition, a dam layer 330 may be formed on the under bump metallurgy layer 329 opposite the substrate. The dam layer 330 may be formed of a material such as chromium to which a subsequently formed bump material does not wet during reflow.

A mask layer 331 (such as a layer of photoresist and/or polymer) may be formed on the conductive under bump metallurgy layer 329, and a hole 333 may be formed in the mask layer 331 to provide a plating template exposing portions of the under bump metallurgy layer 329 opposite the interconnection layer 319. The mask layer 331 may be a layer of photoresist that has been selectively exposed and developed using photolithographic techniques to form the hole 333. After forming the hole 333, portions of the dam layer 330 exposed through the hole 333 may be removed to expose portions of the under bump metallurgy layer 329.

The hole 333 through the mask layer 331 may have an elongate portion and a relatively wide portion when viewed perpendicular from the substrate 321 (i.e. when viewed from above the substrate 321 in the orientation illustrated in FIG. 10). More particularly, the relatively wide portion of the hole 333 may be offset from the interconnection layer 319, and the elongate portion of the hole 333 may extend from the relatively wide portion of the hole to adjacent the interconnection layer 319. For example, the hole 333 may have a keyhole shape with the relatively wide (i.e. circular) portion of the keyhole shape offset from the interconnection layer 319, and with the elongate portion of the keyhole shape extending adjacent the interconnection layer 319.

Figure 11:
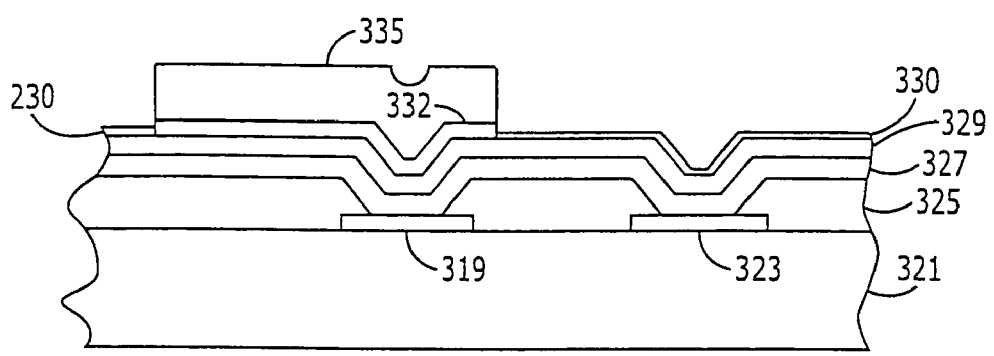

A second barrier layer 332 (such as a layer of nickel) and a bumping material 335 (such as a tin based solder, gold, and/or copper) may then be selectively formed on portions of the conductive under bump metallurgy layer 329 exposed by the hole 333. For example, the second barrier layer 332 and the bumping material 335 may be electroplated with the under bump metallurgy layer 329 providing a plating electrode and a current path under the mask 331. In an alternative, electroless plating may be used so that a current path under the mask is not needed during plating. Other deposition techniques may also be used. After forming the second barrier layer 332 and the bumping material 335, the mask 331 can be stripped, for example, using a dry and/or wet process chemistry. Accordingly, the second barrier layer 332 and the bumping material 335 may have enlarged width portions spaced apart from the interconnection layer 319 and elongate portions between the enlarged width portions and the interconnection layer 319. As shown in FIG. 11, the mask 331 may be removed.

Figure 12:
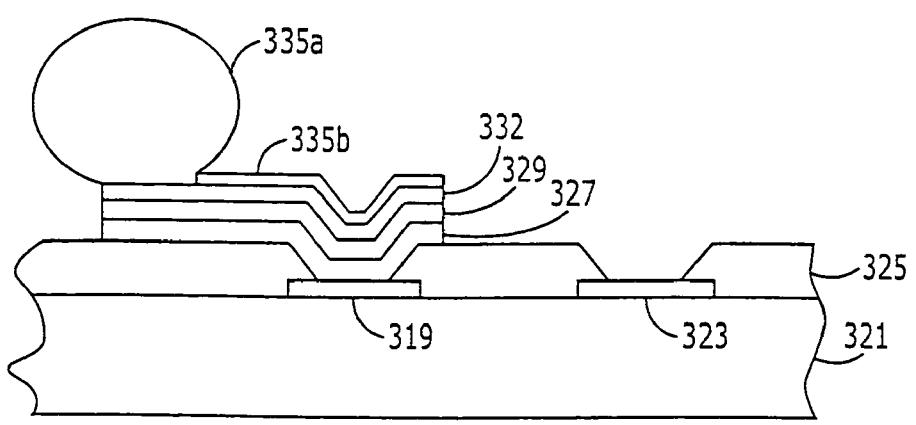

As shown in FIG. 12, the bumping material 335 may be subjected to a reflow operation. Due to differences in radius of curvature over the enlarged width and elongate portions of the bumping material 335, internal pressures may drive bumping material from the elongate portion to the enlarged width portion. Accordingly, a relatively thin portion 335*b* may remain at the elongate portion while a relatively thick portion 335*a* may form at the enlarged width portion. Moreover, the dam layer 330 may confine the bumping material 335 to the enlarged width and elongate portions during reflow.

Portions of the conductive under bump metallurgy layer 329 not covered by the bumping material 335 (including relatively thick and thin portions 335*a-b*) and/or the second barrier layer 332 can be removed. More particularly, portions of the conductive under bump metallurgy layer 329 can be removed using an etch chemistry that removes the conductive under bump metallurgy layer 329 preferentially with respect to the first barrier layer 327. Accordingly, the first barrier layer 327 may protect the metal layer 323 while removing portions of the under bump metallurgy layer 329. With a conductive under bump metallurgy layer 329 of copper (Cu) and a first barrier layer 327 of titanium-tungsten (TiW), Ammonium Hydroxide may be used to selectively remove the conductive under bump metallurgy layer 329 while maintaining the metal layer 323.

Portions of the first barrier layer 327 not covered by the bumping material 335, the second barrier layer 332, and/or remaining portions of the under bump metallurgy layer 329 can then be removed using an etch chemistry that removes the first barrier layer 327 preferentially with respect to the metal layer 323. Accordingly, the first barrier layer 327 may be removed without significantly damaging the metal layer 323. With a first barrier layer 327 of titanium-tungsten (TiW) and a metal layer 323 of aluminum (Al), portions of the first barrier layer 327 may be removed using a mixture including:

Hydrogen peroxide—10-20%;

Sulfosalicylic acid—2-30 grams/liter;

Potassium sulfate—25-200 grams/liter;

Benzotrizole—1-10 grams/liter;

Water for makeup;

Temp: 30 to 70 deg C.; and pH<7.

Redistribution routing conductors are discussed, for example, in U.S. Pat. Nos. 5,892,179, 6,329,608, and/or U.S. Pat. No. 6,389,691. The disclosures of each of these patents are hereby incorporated herein in their entirety by reference.

In an alternative, portions of the under bump metallurgy layer 327 and the first barrier layer 329 not covered by the second barrier layer 332 and/or the bumping material 335 of FIG. 11 may be removed before reflowing the bumping material 335. Accordingly, the dam layer 330 may be omitted, and flow of the bumping material 335 may be confined by using a passivation layer 325 to which the bumping material does not wet. After removing portions of under bump metallurgy layer 329 and first barrier layer 327, the bumping material may be subjected to reflow so that a relatively thin layer 335b is provided on elongate portions and a relatively thick layer 335a is provided on enlarged width portions as shown in FIG. 12.

With a tin based solder bumping material, for example, the bumping material 335 may be fluxed, reflowed, and cleaned to provide the ball of bumping material 335 of FIG. 12. With a gold bumping material, the bumping material 335 may be annealed.

As shown in FIG. 12, a ball of the bumping material 335 may be formed, and the ball (relatively thick portion 335b) of the bumping material 335 may be electrically connected to the interconnection layer 319 through a redistribution routing conductor comprising remaining elongate portions of the first barrier layer 327, the under bump metallurgy layer 329, and/or the relatively thin portion 335b of the bumping material 335. Moreover, the metal layer 323 (such as an aluminum layer) may be exposed as shown in FIG. 12.

Accordingly, the bumping material 335 can be used to provide electrical and/or mechanical coupling to another substrate (such as another integrated circuit semiconductor device and/or a printed circuit board) while the metal layer 323 is exposed. Accordingly, the metal layer 323 may be burned, cut, probed, and/or wire bonded after forming the bumping material 335 and/or after bonding the bumping material 335 to another substrate.

Figure 13:
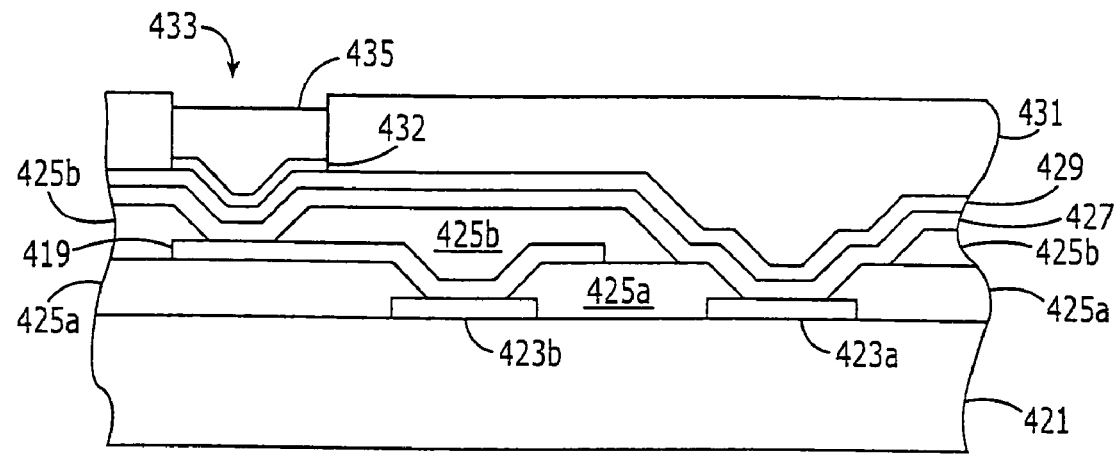
FIGS. 13-14 are cross sectional views illustrating integrated circuit devices during intermediate fabrication steps according to fourth embodiments of the present invention.

Fourth embodiments of the present invention are discussed below with reference to FIGS. 13-14. As shown in FIG. 13, an integrated circuit substrate 421 may have first and second metal layers 423a-b and a first passivation layer 425a may be provided on the metal layers 423a-b, and the substrate 421. The metal layers 423a-b may be patterned from a same metal layer (such as a same aluminum layer). The integrated circuit substrate 421 may include a semiconductor substrate (such as a silicon, gallium arsenide, gallium nitride, and/or silicon carbide substrate) having electronic devices (such as transistors, diodes, resistors, capacitors, and/or inductors) formed thereon. As used herein, the term substrate may be used to refer to a wafer including a plurality of integrated circuit devices thereon or to an integrated circuit die including a single integrated circuit device thereon. Typically, a plurality of die can be cut from a single wafer after fabrication of a plurality of integrated circuit devices on the single wafer. In other alternatives, the term substrate may be used to refer to another layer of packaging substrate such as a printed circuit board.

The metal layer 423a, for example, may provide an input/output pad for electronic devices of the substrate 421 to be used as an input/output pad for subsequent wire bonding. In an alternative, the metal layer 423 may provide a fuse that can be cut mechanically and/or with a laser to provide coupling/decoupling of redundant circuitry on the substrate 421. In another alternative, the metal layer 423 may provide a pad for electrical probing of circuitry on the substrate 421. The metal layer 423b may provide an input/output pad for electronic devices of the substrate 421. The metal layers 423a-b may both include aluminum.

The first passivation layer 425a may include an inorganic material (such as silicon dioxide and/or silicon nitride) and/or an organic material (such as polyimide). As shown, holes in the first passivation layer 425a may expose portions of the metal layers 423a-b. More particularly, the first passivation layer 425a may be formed over the metal layers 423a-b, and then portions of the first passivation layer 425a may be selectively removed to expose portions of the metal layers 423a-b. By providing that portions of the metal layer 423a are exposed, the metal layer 423a may be subsequently probed, cut, and/or used as a wire bonding pad.

An interconnection layer 419 may then be formed on the first passivation layer 425a and on portions of the second metal layer 423b. More particularly, the interconnection layer 419 may extend from exposed portions of the second metal layer 423b to provide electrical connection with subsequently formed bumping material that is offset from the metal layer 423b. The metal layers 423a-b and the interconnection layer 419 may both include aluminum.

In addition, a second passivation layer 425b may be formed on the interconnection layer 419, on the first passivation layer 425a, and on exposed portions of the first metal layer 423a. Holes may then be formed in the second passivation layer 425b to expose portions of the interconnection layer 419 and the first metal layer 423a. The second passivation layer 425b may include an inorganic material (such as silicon dioxide and/or silicon nitride) and/or an organic material (such as polyimide). The interconnection layer 419 may provide electrical and mechanical interconnection through a bumping material to a next level substrate (such as a printed circuit board or an integrated circuit device) as discussed in greater detail below.

A first barrier layer 427 (such as a layer of TiW, TiN, and/or combinations thereof) may be formed on the second passivation layer 425b, and on exposed portions of the interconnection layer 419, the first passivation layer 425a, and the first metal layer 423a, for example, using sputtering, evaporation, and/or chemical vapor deposition (CVD). The exposed surface of the first barrier layer 427 may be subjected to cleaning using wet and/or dry cleaning operations before a subsequent step of forming under bump metallurgy layer 429. The first barrier layer 427 may be selected to provide adhesion between the under bump metallurgy layer 429 and the passivation layers 425a and/or 425b; to provide adhesion between the under bump metallurgy layer 429 and the interconnection layer 419; to provide electrical conduction of signals between under bump metallurgy layer 429 and the substrate 421; and/or to provide an etch selectivity with respect to the first metal layer 423a. Accordingly, the first barrier layer 427 may be removed from the first metal layer 423a without significantly damaging the metal layer 423a.

The conductive under bump metallurgy layer 429 may then be formed on the barrier layer 427 opposite the substrate 421, the first metal layer 423a, and the interconnection layer 419. More particularly, the conductive under bump metallurgy layer 429 may include copper (Cu). A mask layer 431 (such as a layer of photoresist and/or polymer) may be formed on the conductive under bump metallurgy layer 429, and a hole 433 may be formed in the mask layer 431 to provide a plating template exposing portions of the under bump metallurgy layer 429 offset from the interconnection layer 419. More particularly, the mask layer 431 may be a layer of photoresist that has been selectively exposed and developed using photolithographic techniques to form the hole 433.

A second barrier layer 432 (such as a layer of nickel) and a bumping material 435 (such as a tin based solder, gold, and/or copper) may then be selectively formed on portions of the conductive under bump metallurgy layer 429 exposed by the hole 433. For example, the second barrier layer 432 and the bumping material 435 may be electroplated with the under bump metallurgy layer 429 providing a plating electrode and a current path under the mask 431. In an alternative, electroless plating may be used so that a current path under the mask is not needed during plating. Other deposition techniques may also be used.

After forming the second barrier layer 432 and the bumping material 435, the mask 431 can be stripped, for example, using a dry and/or wet process chemistry. As shown in FIG. 14, portions of the conductive under bump metallurgy layer 429 not covered by the bumping material 435 and/or the second barrier layer 432 can be removed. More particularly, portions of the conductive under bump metallurgy layer 429 can be removed using an etch chemistry that removes the conductive under bump metallurgy layer 429 preferentially with respect to the first barrier layer 427. Accordingly, the first barrier layer 427 may protect the first metal layer 423a while removing portions of the under bump metallurgy layer 429. With a conductive under bump metallurgy layer 429 of copper (Cu) and a first barrier layer 427 of titanium-tungsten (TiW), Ammonium Hydroxide may be used to selectively remove the conductive under bump metallurgy layer 429 while maintaining the first metal layer 423a.

Portions of the first barrier layer 427 not covered by the bumping material 435, the second barrier layer 432, and/or remaining portions of the under bump metallurgy layer 429 can then be removed using an etch chemistry that removes the first barrier layer 427 preferentially with respect to the first metal layer 423a. Accordingly, the first barrier layer 427 may be removed without significantly damaging the first metal layer 423a. With a first barrier layer 427 of titanium-tungsten (TiW) and a first metal layer 423a of aluminum (Al), portions of the first barrier layer 427 may be removed using a mixture including:

Hydrogen peroxide—10-20%;
Sulfosalicylic acid—2-30 grams/liter;
Potassium sulfate—25-200 grams/liter;
Benzotrizole—1-10 grams/liter;
Water for makeup;
Temp: 30 to 70 deg C.; and
pH<7.

Figure 14:
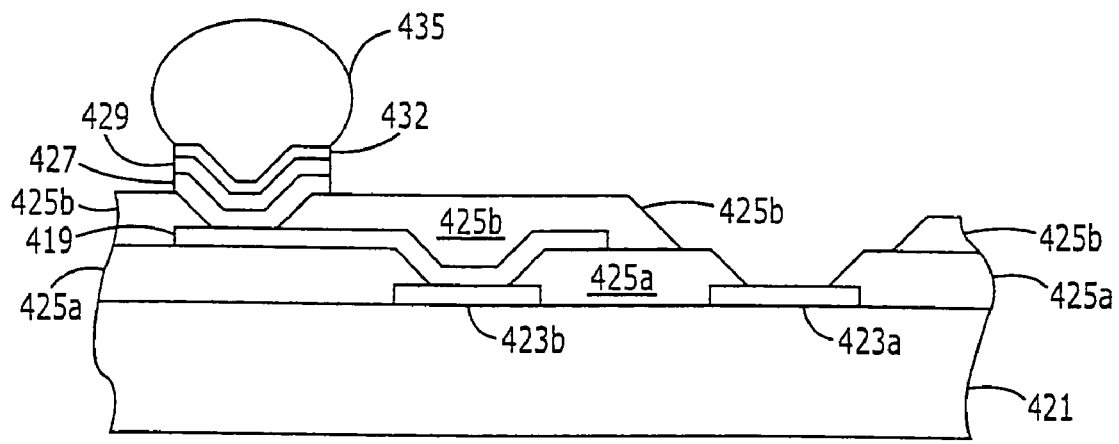

The structure of FIG. 14 can then be heated so that the bumping material 435 forms a ball while the first metal layer 423a (such as an aluminum layer) is exposed. With a tin based solder bumping material, for example, the bumping material 435 may be fluxed, reflowed, and cleaned to provide the ball of bumping material 435. With a gold bumping material, the bumping material 435 may be annealed. In an alternative, the bumping material 435 may be bonded to a compatible substrate without first forming a ball.

Accordingly, the bumping material 435 can be used to provide electrical and/or mechanical coupling to another substrate (such as another integrated circuit semiconductor device and/or a printed circuit board) while the first metal layer 423a is exposed. Accordingly, the first metal layer 423a may be burned, cut, probed, and/or wire bonded after forming the bumping material 435 and/or after bonding the bumping material 435 to another substrate.

Figure 15:
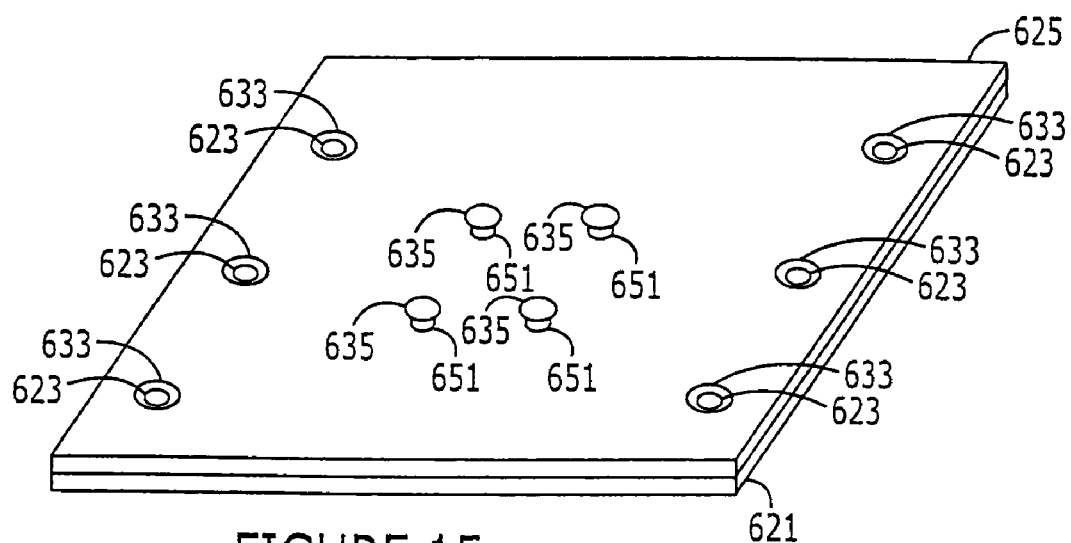
FIGS. 15-17 are perspective views illustrating assembly of electronic devices according to embodiments of the present invention.
Figure 16:
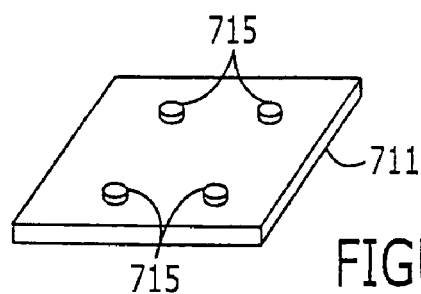
Figure 17:
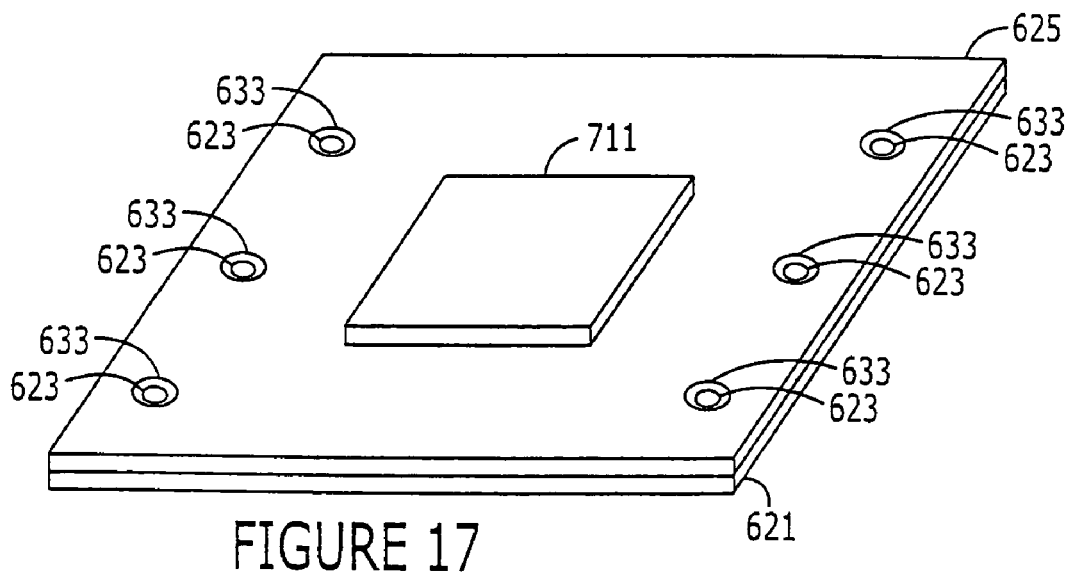

FIGS. 15-17 illustrate assemblies of integrated circuit devices according to further embodiments of the present invention. The integrated circuit device of FIG. 15 may include a substrate 621 and a passivation layer 625 having a plurality of holes 633 therein with each hole exposing a portion of a respective metal layer 623 (such as an aluminum layer). The device of FIG. 15 may also include a plurality of bumps 635 on respective support structures 651. The integrated circuit device of FIG. 15 may thus be provided according to embodiments of the present invention as discussed above with respect to FIGS. 1-4, with respect to FIGS. 5-8, with respect to FIGS. 9-12, and/or with respect to FIGS. 13-14.

Each support structure 651, for example, may include a first barrier layer (such as a layer of TiW, TiN, and/or combinations thereof), an under bump metallurgy layer (such as a layer of copper) on the first barrier layer, and a layer of a second barrier layer (such as a layer of nickel). Each bump 635, for example, may be a tin based solder bump, a gold bump, and/or a copper bump. Moreover, one or more of the bumps 635, for example, may be on a support structure 651 opposite an input/output pad of the substrate 621 as discussed above with respect to FIGS. 5-8. In an alternative, one or more of the bumps 635, for example, may be electrically connected to and offset from a respective input/output pad of the substrate 621 as discussed above with respect to FIGS. 9-12 and with respect to FIGS. 13-14. In addition, each of the metal layers 623 exposed through holes 633 in the passivation layer 625, for example, may be provided as discussed above with respect to FIGS. 1-4, with respect to FIGS. 5-8, with respect to FIGS. 9-12, and/or with respect to FIGS. 13-14. The passivation layer 625, for example, may include an inorganic material (such as silicon dioxide and/or silicon nitride) and/or an organic material (such as polyimide).

As shown in FIG. 16, a second electronic device including a substrate 711 and bonding pads 715 may be provided for coupling with the device of FIG. 15. The device of FIG. 16 may be a semiconductor integrated circuit device including electronic circuits therein. Moreover, the bonding pads 715 may correspond to respective bumps 635 of FIG. 15 for bonding therewith. In an alternative, bumps may be provided on the bonding pads 715 in addition to or instead of bumps 635 of FIG. 15.

As shown in FIG. 17, bonding pads 715 of substrate 711 may be bonded to respective bumps 635 so that substrates 621 and 711 are electrically and mechanically connected. Moreover, the metal layers 623 (such as aluminum layers) may be exposed after providing the bumps 635 and after bonding the substrate 711 using the bumps 635. The metal layers 623, for example, may thus be burned, cut, probed, and/or wire bonded after forming the bumps 635 and/or after bonding the bumps 635 to the second substrate 711. One or more of the metal layers 633, for example, may be burned using a laser and/or mechanically cut to provide coupling and/or decoupling of redundant and/or faulty circuitry within the substrate 621. In an alternative, one or more of the metal layers 635 may be probed to test circuitry within the substrate 612. In another alternative, one or more of the metal layers 635 may receive a wire bond to provide electrical coupling between circuitry within the substrate 621 and another electronic substrate and/or device.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:
1. An electronic device comprising:
a first substrate including a metal layer comprising aluminum on the first substrate;

a barrier layer on the first substrate offset from the metal layer comprising aluminum;

a conductive bump on the barrier layer wherein the barrier layer is between the conductive bump and the first substrate, wherein the conductive bump is offset from the metal layer comprising aluminum, and wherein the barrier layer, the conductive bump, and the metal layer comprising aluminum all comprise different conductive materials;

a second substrate bonded to the conductive bump so that the conductive bump is between the first and second substrates; and a wirebond on the metal layer comprising aluminum wherein the metal layer comprising aluminum is free of the conductive material of the barrier layer thereon;

wherein the conductive bump comprises at least one of solder, gold, and/or copper, wherein the barrier layer comprises titanium tungsten, and wherein the metal layer comprising aluminum is free of titanium tungsten thereon so that a portion of the first substrate is free of titanium tungsten between the substrate and the wirebond.

2. An electronic device according to claim 1 wherein the electronic device comprises an integrated circuit device, and wherein the first substrate comprises an integrated circuit substrate.

3. An electronic device according to claim 1 further comprising a conductive under bump metallurgy layer between the barrier layer and the conductive bump.

4. An electronic device according to claim 1 further comprising:
an input/output pad on the first substrate wherein the barrier layer and the conductive bump are electrically connected to the input/output pad.

5. An electronic device according to claim 4 wherein the input/output pad and the metal layer each comprise aluminum.

6. An electronic device according to claim 4 wherein the conductive bump is on the barrier layer opposite the input/output pad.

7. An electronic device according to claim 4 wherein the conductive bump is offset from the input/output pad.

8. An electronic device according to claim 2 further comprising:
an under bump metallurgy layer between the barrier layer and the conductive bump wherein the under bump metallurgy layer and the barrier layer comprise different materials.

9. An electronic device according to claim 1 further comprising:
an insulating passivation layer on the first substrate and on edge portions of the metal layer comprising aluminum opposite the substrate wherein the insulating passivation layer has an opening therethrough exposing a central portion of the metal layer comprising aluminum, wherein the barrier layer is on portions of the insulating passivation layer, wherein the barrier layer is offset from the opening through the insulating passivation layer, and wherein the conductive bump is offset from the opening through the insulating passivation layer.

10. An electronic device according to claim 9 wherein the wirebond is provided directly on the central portion of the metal layer comprising aluminum.

11. An electronic device comprising:
a first substrate including a metal layer comprising aluminum on the first substrate;
an insulating passivation layer on the first substrate and on edge portions of the metal layer comprising aluminum opposite the substrate wherein the insulating passivation layer has an opening therethrough exposing a central portion of the metal layer comprising aluminum;

a barrier layer comprising titanium tungsten on the first substrate offset from the metal layer comprising aluminum wherein the barrier layer is on portions of the insulating passivation layer opposite the substrate and wherein the barrier layer is offset from the opening through the insulating passivation layer;

a conductive bump on the barrier layer wherein the barrier layer is between the conductive bump and the first substrate, wherein the conductive bump is offset from the metal layer comprising aluminum, wherein the conductive bump is offset from the opening through the insulating passivation layer, wherein the barrier layer, the conductive bump, and the metal layer comprising aluminum all comprise different conductive materials, and wherein the conductive bump comprises at least one of solder, gold, and/or copper;

a second substrate bonded to the conductive bump so that the conductive bump is between the first and second substrates; and a wirebond on the metal layer comprising aluminum wherein the wirebond is on the central portion of the metal layer comprising aluminum exposed through the opening through the passivation layer and wherein the metal layer comprising aluminum is free of titanium tungsten thereon between the metal layer comprising aluminum and the wirebond.

12. An electronic device according to claim 11 wherein the wirebond is provided directly on the central portion of the metal layer comprising aluminum.

13. An electronic device according to claim 11 wherein the electronic device comprises an integrated circuit device, and wherein the first substrate comprises an integrated circuit substrate.

14. An electronic device according to claim 13 further comprising:
an under bump metallurgy layer between the barrier layer and the conductive bump wherein the under bump metallurgy layer and the barrier layer comprise different materials.

15. An electronic device according to claim 11 further comprising a conductive under bump metallurgy layer between the barrier layer and the conductive bump.

16. An electronic device according to claim 11 further comprising:
an input/output pad on the first substrate wherein a central portion of the input/output pad is exposed through a second opening through the insulating passivation layer, wherein edge portions of the input/output pad are between the insulating passivation layer and the first substrate, and wherein the barrier layer and the conductive bump are electrically connected to the input/output pad through the second opening through the insulating passivation layer.

17. An electronic device according to claim 16 wherein the input/output pad and the metal layer each comprise aluminum.

18. An electronic device according to claim 16 wherein the conductive bump is on the barrier layer opposite the input/output pad.

19. An electronic device according to claim 16 wherein the conductive bump is offset from the input/output pad.

* * * * *